United States Patent
Chaji et al.

(10) Patent No.: US 9,224,954 B2
(45) Date of Patent: Dec. 29, 2015

(54) ORGANIC LIGHT EMITTING DIODE AND METHOD OF MANUFACTURING

(71) Applicant: Ignis Innovation Inc., Waterloo (CA)

(72) Inventors: Gholamreza Chaji, Waterloo (CA); Maryam Moradi, Melrose, MA (US)

(73) Assignee: Ignis Innovation Inc., Waterloo (CA)

( * ) Notice: Subject to any disclaimer, the term of this patent is extended or adjusted under 35 U.S.C. 154(b) by 0 days.

(21) Appl. No.: 14/525,720

(22) Filed: Oct. 28, 2014

(65) Prior Publication Data

US 2015/0044791 A1    Feb. 12, 2015

Related U.S. Application Data

(62) Division of application No. 13/561,411, filed on Jul. 30, 2012, now Pat. No. 8,901,579.

(60) Provisional application No. 61/514,886, filed on Aug. 3, 2011.

(51) Int. Cl.
| | |
|---|---|
| *H01L 21/00* | (2006.01) |
| *H01L 51/00* | (2006.01) |
| *H01L 51/56* | (2006.01) |
| *H01L 27/32* | (2006.01) |

(52) U.S. Cl.
CPC ........ *H01L 51/0024* (2013.01); *H01L 51/0023* (2013.01); *H01L 51/56* (2013.01); *H01L 27/3251* (2013.01)

(58) Field of Classification Search
CPC .. H01L 51/0023; H01L 51/0024; H01L 51/56
USPC ....................................................... 438/26, 34
See application file for complete search history.

(56) References Cited

U.S. PATENT DOCUMENTS

| | | | |
|---|---|---|---|
| 4,354,162 | A | 10/1982 | Wright |
| 4,758,831 | A | 7/1988 | Kasahara et al. |
| 4,963,860 | A | 10/1990 | Stewart |

(Continued)

FOREIGN PATENT DOCUMENTS

| | | |
|---|---|---|
| CA | 1294034 | 1/1992 |
| CA | 2109951 | 11/1992 |

(Continued)

OTHER PUBLICATIONS

Ahnood et al.: "Effect of threshold voltage instability on field effect mobility in thin film transistors deduced from constant current measurements"; dated Aug. 2009 (3 pages).

(Continued)

*Primary Examiner* — David S Blum
(74) *Attorney, Agent, or Firm* — Nixon Peabody LLP

(57) ABSTRACT

Aspects of the present disclosure provide for manufacturing an organic light emitting diode (OLED) by forming two terminals of the OLED on two substrates of the display, and then depositing a plurality of layers of the OLED on one or both of the two terminals to form a first portion and a second portion of the OLED on each substrate. The two portions are joined together to form an assembled OLED. The deposition of the two portions can be stopped with each portion having approximately half of a common layer exposed. The two portions can then be aligned to be joined together and an annealing process can be employed to join together the two parts of the common layer and thereby form the OLED.

3 Claims, 7 Drawing Sheets

(56) References Cited

U.S. PATENT DOCUMENTS

| | | | |
|---|---|---|---|
| 4,975,691 | A | 12/1990 | Lee |
| 4,996,523 | A | 2/1991 | Bell et al. |
| 5,051,739 | A | 9/1991 | Hayashida et al. |
| 5,222,082 | A | 6/1993 | Plus |
| 5,266,515 | A | 11/1993 | Robb et al. |
| 5,498,880 | A | 3/1996 | Lee et al. |
| 5,589,847 | A | 12/1996 | Lewis |
| 5,619,033 | A | 4/1997 | Weisfield |
| 5,648,276 | A | 7/1997 | Hara et al. |
| 5,670,973 | A | 9/1997 | Bassetti et al. |
| 5,684,365 | A | 11/1997 | Tang et al. |
| 5,686,935 | A | 11/1997 | Weisbrod |
| 5,712,653 | A | 1/1998 | Katoh et al. |
| 5,714,968 | A | 2/1998 | Ikeda |
| 5,747,928 | A | 5/1998 | Shanks et al. |
| 5,748,160 | A | 5/1998 | Shieh et al. |
| 5,784,042 | A | 7/1998 | Ono et al. |
| 5,790,234 | A | 8/1998 | Matsuyama |
| 5,815,303 | A | 9/1998 | Berlin |
| 5,870,071 | A | 2/1999 | Kawahata |
| 5,874,803 | A | 2/1999 | Garbuzov et al. |
| 5,880,582 | A | 3/1999 | Sawada |
| 5,903,248 | A | 5/1999 | Irwin |
| 5,917,280 | A | 6/1999 | Burrows et al. |
| 5,923,794 | A | 7/1999 | McGrath et al. |
| 5,952,789 | A | 9/1999 | Stewart et al. |
| 5,990,629 | A | 11/1999 | Yamada et al. |
| 6,023,259 | A | 2/2000 | Howard et al. |
| 6,069,365 | A | 5/2000 | Chow et al. |
| 6,081,131 | A | 6/2000 | Ishii |
| 6,091,203 | A | 7/2000 | Kawashima et al. |
| 6,097,360 | A | 8/2000 | Holloman |
| 6,144,222 | A | 11/2000 | Ho |
| 6,157,583 | A | 12/2000 | Starnes et al. |
| 6,166,489 | A | 12/2000 | Thompson et al. |
| 6,177,915 | B1 | 1/2001 | Beeteson et al. |
| 6,225,846 | B1 | 5/2001 | Wada et al. |
| 6,229,508 | B1 | 5/2001 | Kane |
| 6,232,939 | B1 | 5/2001 | Saito et al. |
| 6,246,180 | B1 | 6/2001 | Nishigaki |
| 6,252,248 | B1 | 6/2001 | Sano et al. |
| 6,259,424 | B1 | 7/2001 | Kurogane |
| 6,274,887 | B1 | 8/2001 | Yamazaki et al. |
| 6,288,696 | B1 | 9/2001 | Holloman |
| 6,300,928 | B1 | 10/2001 | Kim |
| 6,303,963 | B1 | 10/2001 | Ohtani et al. |
| 6,306,694 | B1 | 10/2001 | Yamazaki et al. |
| 6,307,322 | B1 | 10/2001 | Dawson et al. |
| 6,316,786 | B1 | 11/2001 | Mueller et al. |
| 6,320,325 | B1 | 11/2001 | Cok et al. |
| 6,323,631 | B1 | 11/2001 | Juang |
| 6,323,832 | B1 | 11/2001 | Nishizawa et al. |
| 6,345,085 | B1 | 2/2002 | Yeo et al. |
| 6,348,835 | B1 | 2/2002 | Sato et al. |
| 6,365,917 | B1 | 4/2002 | Yamazaki |
| 6,373,453 | B1 | 4/2002 | Yudasaka |
| 6,384,427 | B1 | 5/2002 | Yamazaki et al. |
| 6,392,617 | B1 | 5/2002 | Gleason |
| 6,399,988 | B1 | 6/2002 | Yamazaki |
| 6,414,661 | B1 | 7/2002 | Shen et al. |
| 6,420,758 | B1 | 7/2002 | Nakajima |
| 6,420,834 | B2 | 7/2002 | Yamazaki et al. |
| 6,420,988 | B1 | 7/2002 | Azami et al. |
| 6,433,488 | B1 | 8/2002 | Bu |
| 6,445,376 | B2 | 9/2002 | Parrish |
| 6,468,638 | B2 | 10/2002 | Jacobsen et al. |
| 6,489,952 | B1 | 12/2002 | Tanaka et al. |
| 6,501,098 | B2 | 12/2002 | Yamazaki |
| 6,501,466 | B1 | 12/2002 | Yamagashi et al. |
| 6,512,271 | B1 | 1/2003 | Yamazaki et al. |
| 6,518,594 | B1 | 2/2003 | Nakajima et al. |
| 6,524,895 | B2 | 2/2003 | Yamazaki et al. |
| 6,531,713 | B1 | 3/2003 | Yamazaki |
| 6,559,594 | B2 | 5/2003 | Fukunaga et al. |
| 6,573,195 | B1 | 6/2003 | Yamazaki et al. |
| 6,573,584 | B1 | 6/2003 | Nagakari et al. |
| 6,576,926 | B1 | 6/2003 | Yamazaki et al. |
| 6,580,408 | B1 | 6/2003 | Bae et al. |
| 6,580,657 | B2 | 6/2003 | Sanford et al. |
| 6,583,775 | B1 | 6/2003 | Sekiya et al. |
| 6,583,776 | B2 | 6/2003 | Yamazaki et al. |
| 6,587,086 | B1 | 7/2003 | Koyama |
| 6,593,691 | B2 | 7/2003 | Nishi et al. |
| 6,594,606 | B2 | 7/2003 | Everitt |
| 6,597,203 | B2 | 7/2003 | Forbes |
| 6,611,108 | B2 | 8/2003 | Kimura |
| 6,617,644 | B1 | 9/2003 | Yamazaki et al. |
| 6,618,030 | B2 | 9/2003 | Kane et al. |
| 6,641,933 | B1 | 11/2003 | Yamazaki et al. |
| 6,661,180 | B2 | 12/2003 | Koyama |
| 6,661,397 | B2 | 12/2003 | Mikami et al. |
| 6,670,637 | B2 | 12/2003 | Yamazaki et al. |
| 6,677,713 | B1 | 1/2004 | Sung |
| 6,680,577 | B1 | 1/2004 | Inukai et al. |
| 6,687,266 | B1 | 2/2004 | Ma et al. |
| 6,690,344 | B1 | 2/2004 | Takeuchi et al. |
| 6,693,388 | B2 | 2/2004 | Oomura |
| 6,693,610 | B2 | 2/2004 | Shannon et al. |
| 6,697,057 | B2 | 2/2004 | Koyama et al. |
| 6,720,942 | B2 | 4/2004 | Lee et al. |
| 6,734,636 | B2 | 5/2004 | Sanford et al. |
| 6,738,034 | B2 | 5/2004 | Kaneko et al. |
| 6,738,035 | B1 | 5/2004 | Fan |
| 6,771,028 | B1 | 8/2004 | Winters |
| 6,777,712 | B2 | 8/2004 | Sanford et al. |
| 6,780,687 | B2 | 8/2004 | Nakajima et al. |
| 6,806,638 | B2 | 10/2004 | Lih et al. |
| 6,806,857 | B2 | 10/2004 | Sempel et al. |
| 6,809,706 | B2 | 10/2004 | Shimoda |
| 6,859,193 | B1 | 2/2005 | Yumoto |
| 6,861,670 | B1 | 3/2005 | Ohtani et al. |
| 6,873,117 | B2 | 3/2005 | Ishizuka |
| 6,873,320 | B2 | 3/2005 | Nakamura |
| 6,878,968 | B1 | 4/2005 | Ohnuma |
| 6,909,114 | B1 | 6/2005 | Yamazaki |
| 6,909,419 | B2 | 6/2005 | Zavracky et al. |
| 6,919,871 | B2 | 7/2005 | Kwon |
| 6,937,215 | B2 | 8/2005 | Lo |
| 6,940,214 | B1 | 9/2005 | Komiya et al. |
| 6,943,500 | B2 | 9/2005 | LeChevalier |
| 6,954,194 | B2 | 10/2005 | Matsumoto et al. |
| 6,956,547 | B2 | 10/2005 | Bae et al. |
| 6,995,510 | B2 | 2/2006 | Murakami et al. |
| 6,995,519 | B2 | 2/2006 | Arnold et al. |
| 7,022,556 | B1 | 4/2006 | Adachi |
| 7,023,408 | B2 | 4/2006 | Chen et al. |
| 7,027,015 | B2 | 4/2006 | Booth, Jr. et al. |
| 7,034,793 | B2 | 4/2006 | Sekiya et al. |
| 7,088,051 | B1 | 8/2006 | Cok |
| 7,106,285 | B2 | 9/2006 | Naugler |
| 7,116,058 | B2 | 10/2006 | Lo et al. |
| 7,129,914 | B2 | 10/2006 | Knapp et al. |
| 7,129,917 | B2 | 10/2006 | Yamazaki et al. |
| 7,141,821 | B1 | 11/2006 | Yamazaki et al. |
| 7,161,566 | B2 | 1/2007 | Cok et al. |
| 7,193,589 | B2 | 3/2007 | Yoshida et al. |
| 7,199,516 | B2 | 4/2007 | Seo et al. |
| 7,220,997 | B2 | 5/2007 | Nakata |
| 7,235,810 | B1 | 6/2007 | Yamazaki et al. |
| 7,245,277 | B2 | 7/2007 | Ishizuka |
| 7,248,236 | B2 | 7/2007 | Nathan et al. |
| 7,264,979 | B2 | 9/2007 | Yamagata et al. |
| 7,274,345 | B2 | 9/2007 | Imamura et al. |
| 7,274,363 | B2 | 9/2007 | Ishizuka et al. |
| 7,279,711 | B1 | 10/2007 | Yamazaki et al. |
| 7,304,621 | B2 | 12/2007 | Oomori et al. |
| 7,310,092 | B2 | 12/2007 | Imamura |
| 7,315,295 | B2 | 1/2008 | Kimura |
| 7,317,429 | B2 | 1/2008 | Shirasaki et al. |
| 7,319,465 | B2 | 1/2008 | Mikami et al. |
| 7,321,348 | B2 | 1/2008 | Cok et al. |
| 7,339,636 | B2 | 3/2008 | Voloschenko et al. |
| 7,355,574 | B1 | 4/2008 | Leon et al. |
| 7,358,941 | B2 | 4/2008 | Ono et al. |

(56) References Cited

U.S. PATENT DOCUMENTS

| | | |
|---|---|---|
| 7,402,467 B1 | 7/2008 | Kadono et al. |
| 7,414,600 B2 | 8/2008 | Nathan et al. |
| 7,432,885 B2 | 10/2008 | Asano et al. |
| 7,474,285 B2 | 1/2009 | Kimura |
| 7,485,478 B2 | 2/2009 | Yamagata et al. |
| 7,502,000 B2 | 3/2009 | Yuki et al. |
| 7,535,449 B2 | 5/2009 | Miyazawa |
| 7,554,512 B2 | 6/2009 | Steer |
| 7,569,849 B2 | 8/2009 | Nathan et al. |
| 7,619,594 B2 | 11/2009 | Hu |
| 7,619,597 B2 | 11/2009 | Nathan et al. |
| 7,697,052 B1 | 4/2010 | Yamazaki et al. |
| 7,825,419 B2 | 11/2010 | Yamagata et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,948,170 B2 | 5/2011 | Striakhilev et al. |
| 7,969,390 B2 | 6/2011 | Yoshida |
| 7,995,010 B2 | 8/2011 | Yamazaki et al. |
| 8,044,893 B2 | 10/2011 | Nathan et al. |
| 8,115,707 B2 | 2/2012 | Nathan et al. |
| 8,378,362 B2 | 2/2013 | Heo et al. |
| 8,493,295 B2 | 7/2013 | Yamazaki et al. |
| 8,497,525 B2 | 7/2013 | Yamagata et al. |
| 2001/0002703 A1 | 6/2001 | Koyama |
| 2001/0004190 A1 | 6/2001 | Nishi et al. |
| 2001/0013806 A1 | 8/2001 | Notani |
| 2001/0015653 A1 | 8/2001 | De Jong et al. |
| 2001/0020926 A1 | 9/2001 | Kuijk |
| 2001/0026127 A1 | 10/2001 | Yoneda et al. |
| 2001/0026179 A1 | 10/2001 | Saeki |
| 2001/0026257 A1 | 10/2001 | Kimura |
| 2001/0030323 A1 | 10/2001 | Ikeda |
| 2001/0033199 A1 | 10/2001 | Aoki |
| 2001/0038098 A1 | 11/2001 | Yamazaki et al. |
| 2001/0043173 A1 | 11/2001 | Troutman |
| 2001/0045929 A1 | 11/2001 | Prache et al. |
| 2001/0052606 A1 | 12/2001 | Sempel et al. |
| 2001/0052898 A1 | 12/2001 | Osame et al. |
| 2002/0000576 A1 | 1/2002 | Inukai |
| 2002/0011796 A1 | 1/2002 | Koyama |
| 2002/0011799 A1 | 1/2002 | Kimura |
| 2002/0011981 A1 | 1/2002 | Kuijk |
| 2002/0015031 A1 | 2/2002 | Fujita et al. |
| 2002/0015032 A1 | 2/2002 | Koyama et al. |
| 2002/0030528 A1 | 3/2002 | Matsumoto et al. |
| 2002/0030647 A1 | 3/2002 | Hack et al. |
| 2002/0036463 A1 | 3/2002 | Yoneda et al. |
| 2002/0047852 A1 | 4/2002 | Inukai et al. |
| 2002/0048829 A1 | 4/2002 | Yamazaki et al. |
| 2002/0050795 A1 | 5/2002 | Imura |
| 2002/0053401 A1 | 5/2002 | Ishikawa et al. |
| 2002/0070909 A1 | 6/2002 | Asano et al. |
| 2002/0080108 A1 | 6/2002 | Wang |
| 2002/0084463 A1 | 7/2002 | Sanford et al. |
| 2002/0101172 A1 | 8/2002 | Bu |
| 2002/0101433 A1 | 8/2002 | McKnight |
| 2002/0113248 A1 | 8/2002 | Yamagata et al. |
| 2002/0122308 A1 | 9/2002 | Ikeda |
| 2002/0130686 A1 | 9/2002 | Forbes |
| 2002/0154084 A1 | 10/2002 | Tanaka et al. |
| 2002/0158823 A1 | 10/2002 | Zavracky et al. |
| 2002/0163314 A1 | 11/2002 | Yamazaki et al. |
| 2002/0167471 A1 | 11/2002 | Everitt |
| 2002/0180369 A1 | 12/2002 | Koyama |
| 2002/0180721 A1 | 12/2002 | Kimura et al. |
| 2002/0186214 A1 | 12/2002 | Siwinski |
| 2002/0190332 A1 | 12/2002 | Lee et al. |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0062524 A1 | 4/2003 | Kimura |
| 2003/0063081 A1 | 4/2003 | Kimura et al. |
| 2003/0071804 A1 | 4/2003 | Yamazaki et al. |
| 2003/0076048 A1 | 4/2003 | Rutherford |
| 2003/0090445 A1 | 5/2003 | Chen et al. |
| 2003/0090447 A1 | 5/2003 | Kimura |
| 2003/0090481 A1 | 5/2003 | Kimura |
| 2003/0095087 A1 | 5/2003 | Libsch |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0140958 A1 | 7/2003 | Yang et al. |
| 2003/0151569 A1 | 8/2003 | Lee et al. |
| 2003/0169219 A1 | 9/2003 | LeChevalier |
| 2003/0174152 A1 | 9/2003 | Noguchi |
| 2003/0179626 A1 | 9/2003 | Sanford et al. |
| 2003/0197663 A1 | 10/2003 | Lee et al. |
| 2003/0206060 A1 | 11/2003 | Suzuki |
| 2003/0230980 A1 | 12/2003 | Forrest et al. |
| 2004/0027063 A1 | 2/2004 | Nishikawa |
| 2004/0056604 A1 | 3/2004 | Shih et al. |
| 2004/0066357 A1 | 4/2004 | Kawasaki |
| 2004/0070557 A1 | 4/2004 | Asano et al. |
| 2004/0080262 A1 | 4/2004 | Park et al. |
| 2004/0080470 A1 | 4/2004 | Yamazaki et al. |
| 2004/0090400 A1 | 5/2004 | Yoo |
| 2004/0108518 A1 | 6/2004 | Jo |
| 2004/0113903 A1 | 6/2004 | Mikami et al. |
| 2004/0129933 A1 | 7/2004 | Nathan et al. |
| 2004/0130516 A1 | 7/2004 | Nathan et al. |
| 2004/0135749 A1 | 7/2004 | Kondakov et al. |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174349 A1 | 9/2004 | Libsch |
| 2004/0183759 A1 | 9/2004 | Stevenson et al. |
| 2004/0189627 A1 | 9/2004 | Shirasaki et al. |
| 2004/0196275 A1 | 10/2004 | Hattori |
| 2004/0201554 A1 | 10/2004 | Satoh |
| 2004/0207615 A1 | 10/2004 | Yumoto |
| 2004/0233125 A1 | 11/2004 | Tanghe et al. |
| 2004/0239596 A1 | 12/2004 | Ono et al. |
| 2004/0252089 A1 | 12/2004 | Ono et al. |
| 2004/0257355 A1 | 12/2004 | Naugler |
| 2004/0263437 A1 | 12/2004 | Hattori |
| 2005/0007357 A1 | 1/2005 | Yamashita et al. |
| 2005/0030267 A1 | 2/2005 | Tanghe et al. |
| 2005/0035709 A1 | 2/2005 | Furuie et al. |
| 2005/0067970 A1 | 3/2005 | Libsch et al. |
| 2005/0067971 A1 | 3/2005 | Kane |
| 2005/0068270 A1 | 3/2005 | Awakura |
| 2005/0088085 A1 | 4/2005 | Nishikawa et al. |
| 2005/0088103 A1 | 4/2005 | Kageyama et al. |
| 2005/0110420 A1 | 5/2005 | Arnold et al. |
| 2005/0117096 A1 | 6/2005 | Voloschenko et al. |
| 2005/0140598 A1 | 6/2005 | Kim et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2005/0168416 A1 | 8/2005 | Hashimoto et al. |
| 2005/0206590 A1 | 9/2005 | Sasaki et al. |
| 2005/0225686 A1 | 10/2005 | Brummack et al. |
| 2005/0260777 A1 | 11/2005 | Brabec et al. |
| 2005/0269959 A1 | 12/2005 | Uchino et al. |
| 2005/0269960 A1 | 12/2005 | Ono et al. |
| 2005/0285822 A1 | 12/2005 | Reddy et al. |
| 2005/0285825 A1 | 12/2005 | Eom et al. |
| 2006/0007072 A1 | 1/2006 | Choi et al. |
| 2006/0012310 A1 | 1/2006 | Chen et al. |
| 2006/0027807 A1 | 2/2006 | Nathan et al. |
| 2006/0030084 A1 | 2/2006 | Young |
| 2006/0038758 A1 | 2/2006 | Routley et al. |
| 2006/0044227 A1 | 3/2006 | Hadcock |
| 2006/0066527 A1 | 3/2006 | Chou |
| 2006/0092185 A1 | 5/2006 | Jo et al. |
| 2006/0232522 A1 | 10/2006 | Roy et al. |
| 2006/0261841 A1 | 11/2006 | Fish |

(56) References Cited

U.S. PATENT DOCUMENTS

| | | |
|---|---|---|
| 2006/0264143 A1 | 11/2006 | Lee et al. |
| 2006/0273997 A1 | 12/2006 | Nathan et al. |
| 2006/0284801 A1 | 12/2006 | Yoon et al. |
| 2007/0001937 A1 | 1/2007 | Park et al. |
| 2007/0001939 A1 | 1/2007 | Hashimoto et al. |
| 2007/0008268 A1 | 1/2007 | Park et al. |
| 2007/0008297 A1 | 1/2007 | Bassetti |
| 2007/0046195 A1 | 3/2007 | Chin et al. |
| 2007/0069998 A1 | 3/2007 | Naugler et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0080918 A1 | 4/2007 | Kawachi et al. |
| 2007/0103419 A1 | 5/2007 | Uchino et al. |
| 2007/0182671 A1 | 8/2007 | Nathan et al. |
| 2007/0273294 A1 | 11/2007 | Nagayama |
| 2007/0285359 A1 | 12/2007 | Ono |
| 2007/0296672 A1 | 12/2007 | Kim et al. |
| 2008/0042948 A1 | 2/2008 | Yamashita et al. |
| 2008/0055209 A1 | 3/2008 | Cok |
| 2008/0074413 A1 | 3/2008 | Ogura |
| 2008/0088549 A1 | 4/2008 | Nathan et al. |
| 2008/0122803 A1 | 5/2008 | Izadi et al. |
| 2008/0230118 A1 | 9/2008 | Nakatani et al. |
| 2009/0032807 A1 | 2/2009 | Shinohara et al. |
| 2009/0051283 A1 | 2/2009 | Cok et al. |
| 2009/0160743 A1 | 6/2009 | Tomida et al. |
| 2009/0162961 A1 | 6/2009 | Deane |
| 2009/0174628 A1 | 7/2009 | Wang et al. |
| 2009/0213046 A1 | 8/2009 | Nam |
| 2010/0052524 A1 | 3/2010 | Kinoshita |
| 2010/0078230 A1 | 4/2010 | Rosenblatt et al. |
| 2010/0079711 A1 | 4/2010 | Tanaka |
| 2010/0097335 A1 | 4/2010 | Jung et al. |
| 2010/0133994 A1 | 6/2010 | Song et al. |
| 2010/0134456 A1 | 6/2010 | Oyamada |
| 2010/0156279 A1 | 6/2010 | Tamura et al. |
| 2010/0237374 A1 | 9/2010 | Chu et al. |
| 2010/0328294 A1 | 12/2010 | Sasaki et al. |
| 2011/0090210 A1 | 4/2011 | Sasaki et al. |
| 2011/0133636 A1 | 6/2011 | Matsuo et al. |
| 2011/0180825 A1 | 7/2011 | Lee et al. |
| 2012/0212468 A1 | 8/2012 | Govil |
| 2013/0009930 A1 | 1/2013 | Cho et al. |
| 2013/0032831 A1 | 2/2013 | Chaji et al. |
| 2013/0113785 A1 | 5/2013 | Sumi |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 436 451 | 8/2002 |
| CA | 2 438 577 | 8/2002 |
| CA | 2 483 645 | 12/2003 |
| CA | 2 463 653 | 1/2004 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CA | 2526782 | 4/2006 |
| CN | 1381032 | 11/2002 |
| DE | 20 2006 005427 | 6/2006 |
| EP | 0 940 796 | 9/1999 |
| EP | 1 028 471 A | 8/2000 |
| EP | 1 103 947 | 5/2001 |
| EP | 1 130 565 A1 | 9/2001 |
| EP | 1 184 833 | 3/2002 |
| EP | 1 194 013 | 4/2002 |
| EP | 1 310 939 | 5/2003 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 1 439 520 | 7/2004 |
| EP | 1 465 143 A | 10/2004 |
| EP | 1 467 408 | 10/2004 |
| EP | 1 517 290 | 3/2005 |
| EP | 1 521 203 A2 | 4/2005 |
| EP | 2 317499 | 5/2011 |
| GB | 2 205 431 | 12/1988 |
| JP | 09 090405 | 4/1997 |
| JP | 10-153759 | 6/1998 |
| JP | 10-254410 | 9/1998 |
| JP | 11 231805 | 8/1999 |
| JP | 11-282419 | 10/1999 |
| JP | 2000/056847 | 2/2000 |
| JP | 2000-077192 | 3/2000 |
| JP | 2000-089198 | 3/2000 |
| JP | 2000-352941 | 12/2000 |
| JP | 2002-91376 | 3/2002 |
| JP | 2002-268576 | 9/2002 |
| JP | 2002-278513 | 9/2002 |
| JP | 2002-333862 | 11/2002 |
| JP | 2003-022035 | 1/2003 |
| JP | 2003-076331 | 3/2003 |
| JP | 2003-150082 | 5/2003 |
| JP | 2003-177709 | 6/2003 |
| JP | 2003-271095 | 9/2003 |
| JP | 2003-308046 | 10/2003 |
| JP | 2005-057217 | 3/2005 |
| JP | 2006065148 | 3/2006 |
| JP | 2009282158 | 12/2009 |
| TW | 485337 | 5/2002 |
| TW | 502233 | 9/2002 |
| TW | 538650 | 6/2003 |
| TW | 569173 | 1/2004 |
| WO | WO 94/25954 | 11/1994 |
| WO | WO 9948079 | 9/1999 |
| WO | WO 01/27910 A1 | 4/2001 |
| WO | WO 02/067327 A | 8/2002 |
| WO | WO 03/034389 A | 4/2003 |
| WO | WO 03/063124 | 7/2003 |
| WO | WO 03/077231 | 9/2003 |
| WO | WO 03/105117 | 12/2003 |
| WO | WO 2004/003877 | 1/2004 |
| WO | WO 2004/034364 | 4/2004 |
| WO | WO 2005/022498 | 3/2005 |
| WO | WO 2005/029455 | 3/2005 |
| WO | WO 2005/055185 | 6/2005 |
| WO | WO 2006/053424 | 5/2006 |
| WO | WO 2006/063448 A | 6/2006 |
| WO | WO 2006/137337 | 12/2006 |
| WO | WO 2007/003877 A | 1/2007 |
| WO | WO 2007/079572 | 7/2007 |
| WO | WO 2010/023270 | 3/2010 |

OTHER PUBLICATIONS

Alexander et al.: "Pixel circuits and drive schemes for glass and elastic AMOLED displays"; dated Jul. 2005 (9 pages).

Alexander et al.: "Unique Electrical Measurement Technology for Compensation, Inspection, and Process Diagnostics of AMOLED HDTV"; dated May 2010 (4 pages).

Ashtiani et al.: "AMOLED Pixel Circuit With Electronic Compensation of Luminance Degradation"; dated Mar. 2007 (4 pages).

Chaji et al.: "A Current-Mode Comparator for Digital Calibration of Amorphous Silicon AMOLED Displays"; dated Jul. 2008 (5 pages).

Chaji et al.: "A fast settling current driver based on the CCII for AMOLED displays"; dated Dec. 2009 (6 pages).

Chaji et al.: "A Low-Cost Stable Amorphous Silicon AMOLED Display with Full V~T- and V~O~L~E~D Shift Compensation"; dated May 2007 (4 pages).

Chaji et al.: "A low-power driving scheme for a-Si:H active-matrix organic light-emitting diode displays"; dated Jun. 2005 (4 pages).

Chaji et al.: "A low-power high-performance digital circuit for deep submicron technologies"; dated Jun. 2005 (4 pages).

Chaji et al.: "A novel a-Si:H AMOLED pixel circuit based on short-term stress stability of a-Si:H TFTs"; dated Oct. 2005 (3 pages).

(56) References Cited

OTHER PUBLICATIONS

Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-A fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated May 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High- Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
European Search Report and Written Opinion for Application No. 08 86 5338 mailed Nov. 2, 2011 (7 pages).
European Search Report for European Application No. EP 04 78 6661 dated Mar. 9, 2009.
European Search Report for European Application No. EP 05 75 9141 dated Oct. 30, 2009.
European Search Report for European Application No. EP 05 82 1114 dated Mar. 27, 2009 (2 pages).
European Search Report for European Application No. EP 07 71 9579 dated May 20, 2009.
European Search Report mailed Mar. 26, 2012 in corresponding European Patent Application No. 10000421.7 (6 pages).
Extended European Search Report mailed Apr. 27, 2011 issued during prosecution of European patent application No. 09733076.5 (13 pages).

Goh et al., "A New a-Si:H Thin Film Transistor Pixel Circul for Active-Matrix Organic Light-Emitting Diodes", IEEE Electron Device Letters, vol. 24, No. 9, Sep. 2003, 4 pages.
International Search Report for International Application No. PCT/CA02/00180 dated Jul. 31, 2002 (3 pages).
International Search Report for International Application No. PCT/CA2004/001741 dated Feb. 21, 2005.
International Search Report for International Application No. PCT/CA2005/001844 dated Mar. 28, 2006 (2 pages).
International Search Report for International Application No. PCT/CA2005/001007 dated Oct. 18, 2005.
International Search Report for International Application No. PCT/CA2007/000652 dated Jul. 25, 2007.
International Search Report for International Application No. PCT/CA2008/002307, mailed Apr. 28. 2009 (3 pages).
International Search Report for International Application No. PCT/IB2011/055135, Canadian Patent Office, dated Apr. 16, 2012 (5 pages).
International Search Report mailed Jul. 30, 2009 for International Application No. PCT/CA2009/000501 (4 pages).
Jafarabadiashtiani et al.: "A New Driving Method for a-Si AMOLED Displays Based on Voltage Feedback"; dated 2005 (4 pages).
Lee et al.: "Ambipolar Thin-Film Transistors Fabricated by PECVD Nanocrystalline Silicon"; dated 2006 (6 pages).
Ma e y et al: "Organic Light-Emitting Diode/Thin Film Transistor Integration for foldable Displays" Conference record of the 1997 International display research conference and international workshops on LCD technology and emissive technology. Toronto, Sep. 15-19, 1997 (6 pages).
Machine English translation of JP 2002-333862, 49 pages.
Matsueda y et al.: "35.1: 2.5-in. AMOLED with Integrated 6-bit Gamma Compensated Digital Data Driver"; dated May 2004.
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)"; dated 2006 (4 pages).
Nathan et al.: "Thin film imaging technology on glass and plastic" ICM 2000, Proceedings of the 12$^{th}$ International Conference on Microelectronics, (IEEE Cat. No. 00EX453), Tehran Iran; dated Oct. 31-Nov. 2, 2000, pp. 11-14, ISBN: 964-360-057-2, p. 13, col. 1, line 11-48; (4 pages).
Nathan, et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Office Action issued in Chinese Patent Application 200910246264.4 Dated Jul. 5, 2013; 8 pages.
Patent Abstracts of Japan, vol. 1997, No. 08, Aug. 29, 1997, & JP 09 090405 A, Apr. 4, 1997 Abstract.
Patent Abstracts of Japan, vol. 1999, No. 13, Nov. 30, 1999, & JP 11 231805 A, Aug. 27, 1999 Abstract.
Patent Abstracts of Japan, vol. 2000, No. 09, Oct. 13, 2000—JP 2000 172199 A, Jun. 3, 2000, abstract.
Patent Abstracts of Japan, vol. 2002, No. 03, Apr. 3, 2002 (Apr. 4, 2004 & JP 2001 318627 A (Semiconductor EnergyLab DO LTD), Nov. 16, 2001, abstract, paragraphs '01331-01801, paragraph '01691, paragraph '01701, paragraph '01721 and figure 10.
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).

(56) References Cited

OTHER PUBLICATIONS

Safavian et al.: "A novel current scaling active pixel sensor with correlated double sampling readout circuit for real time medical x-ray imaging"; dated May 2007 (7 pages).

Safavian et al.: "A novel hybrid active-passive pixel with correlated double sampling CMOS readout circuit for medical x-ray imaging"; dated May 2008 (4 pages).

Safavian et al.: "Self-compensated a-Si:H detector with current-mode readout circuit for digital X-ray fluoroscopy"; dated Aug. 2005 (4 pages).

Safavian et al.: "TFT active image sensor with current-mode readout circuit for digital x-ray fluoroscopy [5969D-82]"; dated Sep. 2005 (9 pages).

Sanford, James L., et al., "4.2 TFT AMOLED Pixel Circuits and Driving Methods", SID 03 Digest, ISSN/0003, 2003, pp. 10-13.

Stewart M. et al., "Polysilicon TFT technology for active matrix OLED displays" IEEE transactions on electron devices, vol. 48, No. 5; Dated May 2001 (7 pages).

Tatsuya Sasaoka et al., 24.4L; Late-News Paper: A 13.0-inch AM-OLED Display with Top Emitting Structure and Adaptive Current Mode Programmed Pixel Circuit (TAC)', SID 01 Digest, (2001), pp. 384-387.

Vygranenko et al.: "Stability of indium-oxide thin-film transistors by reactive ion beam assisted deposition"; dated 2009.

Wang et al.: "Indium oxides by reactive ion beam assisted evaporation: From material study to device application"; dated Mar. 2009 (6 pages).

Written Opinion mailed Jul. 30, 2009 for International Application No. PCT/CA2009/000501 (6 pages).

Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.

Zhiguo Meng et al; "24.3: Active-Matrix Organic Light-Emitting Diode Display implemented Using Metal-Induced Unilaterally Crystallized Polycrystalline Silicon Thin-Film Transistors", SID 01Digest, (2001), pp. 380-383.

International Search Report for Application No. PCT/IB2014/059409, Canadian Intellectual Property Office, dated Jun. 12, 2014 (4 pages).

International Written Opinion for Application No. PCT/IB2014/059409, Canadian Intellectual Property Office, dated Jun. 12, 2014 (5 pages).

ORGANIC LIGHT EMITTING DIODE AND METHOD OF MANUFACTURING

CROSS-REFERENCE TO RELATED APPLICATION

This application is a divisional of and claims priority to U.S. patent application Ser. No. 13/561,411, filed Jul. 30, 2012, now allowed as U.S. Pat. No. 8,901,579, which claims the benefit of U.S. Provisional Application No. 61/514,886, filed Aug. 3, 2011, each of which is hereby incorporated by reference herein in its entirety.

FIELD OF THE INVENTION

The present disclosure generally relates to organic light emitting diodes, particular to methods of manufacturing organic light emitting diodes for use in displays such as active matrix organic light emitting diode displays.

BACKGROUND

Displays can be created from an array of organic light emitting diodes ("OLEDs") each controlled by individual circuits (i.e., pixel circuits). The individual circuits have transistors for selectively controlling the circuits to be programmed with display information and to emit light according to the display information. OLEDs are emissive display devices which generally emit light according to the amount of current driven through the OLED. OLEDs generally include a light emitting region where positively charged holes meet with electrons. Light is emitted as the electrons are captured by the holes and settle at a lower energy state. The amount of current driven through the OLED is thus proportionate to the number of emission events, and the light emitted from an OLED is accordingly related to the current driven through the OLED. Thin film transistors ("TFTs") fabricated on a substrate can be incorporated into such displays to control the amount of current driven through the OLEDs according to the display information programmed into the individual circuits.

OLEDs can be developed by sequentially depositing layers of material onto a substrate. Such a layering process generally commences and terminates with depositing conductive electrodes (i.e., terminals) such that a completed OLED includes a plurality of layers disposed between two electrodes. To connect the OLED to a TFT of a pixel circuit, an electrical connection is generally made between a terminal of the TFT and one of the electrodes of the OLED through a contact, which process leads to problems due to the precision of the required alignment between the contacts and the OLED terminal and the relative unreliability and inefficiency of the contacts formed.

Applying a voltage across the two electrodes in excess of an operating voltage associated with the OLED generally allows a current to flow through the device and for light to be emitted from an emission region of the OLED. As the OLED ages, the operating voltage of the OLED can shift (e.g., increase). The shift in the OLED operating voltage influences the voltage applied across the TFT, and thereby modifies the current flowing through the OLED, and thus influences the light output of the OLED.

It is desirable, therefore, to configure the pixel circuit such that the terminal of the TFT coupled to the OLED does not influence the voltage applied across the TFT. Such a structure is commonly referred to as a reverse OLED, because one way to develop the structure is to sequentially develop the layers of the OLED in the reverse order. One way to develop a reverse OLED is to start the deposition on the display substrate with the cathode terminal ("layer") instead of the anode terminal ("layer"). However, suitable transparent materials for use as a cathode terminal with a suitably high work function are rare, unavailable and/or expensive. Furthermore, the performance of such devices as have been created is inferior to conventional OLED devices.

Another method for achieving the desired structure is to develop the normal OLED on encapsulation glass and develop a matching contact on the TFT substrate. The two substrates can then be put together. However, the contact quality between the OLED and the matching contact requires careful alignment and consistent pressure. The results across an entire display are not good and displays created with such techniques frequently contain many dead pixels and high voltage OLEDs due to the poor quality of the electrical path between the contact and the OLED.

SUMMARY

Aspects of the present disclosure provide an organic light emitting diode ("OLED") which is prepared by depositing a first terminal on a first substrate, and a second terminal on a second substrate. A plurality of layers forming the inner region of the OLED between the first terminal and the second terminal is divided into a first portion and a second terminal. The first portion of the plurality of layers is then deposited on the first terminal and the second portion of the plurality of layers is deposited on the second terminal. The first substrate and the second substrate are then aligned and the first portion and the second portion are joined together.

The first portion of the plurality of layers can include a first part of a common layer, and the second portion of the plurality of layers can include a second part of the common layer. The first and second parts of the common layer can each be the last deposited of the first and second portions of the plurality of layers, respectively. The first portion and the second portion can be aligned such that the exposed surfaces of the two parts of the common layer meet at an intralayer interface. The two parts of the common layer are annealed together to form a unified common layer, and thereby join together the first and second portions of the OLED.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1A:
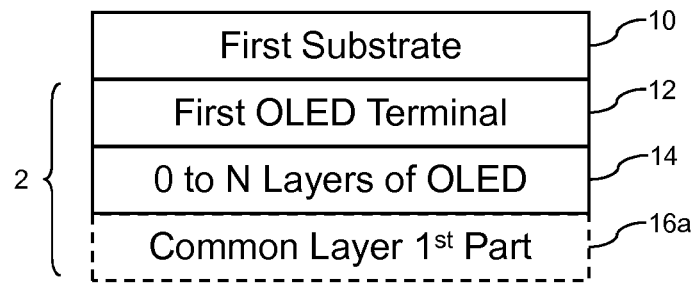
FIG. 1A illustrates a symbolic plan of a first portion of an organic light emitting diode.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1A illustrates a symbolic plan of a first portion 2 of an organic light emitting diode. The first portion 2 is deposited on a first substrate 10 in sequentially developed layers. The first OLED terminal 12 is formed on the first substrate 10. For example, in an implementation where the first substrate 10 is a transparent substrate such as an encapsulation glass, the first OLED terminal can be an anode terminal formed of a transparent conductive material such as indium tin oxide ("ITO"). On the first OLED terminal 12, 0 to N layers 14 of the OLED are deposited. The 0 to N layers 14 can include, for example, a hole injection layer, a hole transfer layer, an emission layer, an electron transfer layer, an electron injection layer, and/or a planarization layer. The 0 to N layers 14 can also include no layers. Appropriately doped semiconductive, organic, and/or inorganic materials can be selected as appropriate for particular implementations of the OLED based on desired emission performance characteristics. Furthermore, one or more of the plurality of layers can be omitted and/or combined with other layers. The first portion 2 can optionally terminate with a first part 16a of a common layer.

Figure 1B:
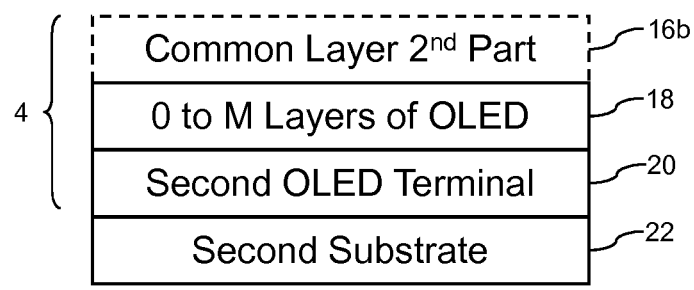
FIG. 1B illustrates a symbolic plan of a second portion of an organic light emitting diode.

FIG. 1B illustrates a symbolic plan of a second portion 4 of an organic light emitting diode. The second portion 4 is formed similarly to the first portion 2. The first portion 4 is deposited on a second substrate 22. For example, the second substrate 22 can be a glass planarization substrate over a terminal of a TFT. The second portion 4 includes a second OLED terminal 20. The second OLED terminal 20 can be a cathode terminal formed of a reflective metallic material having a high work function. On the second OLED terminal 20, 0 to M layers 18 of the OLED are deposited. The 0 to M layers 18 can include, for example, any of the plurality of layers recited for the 0 to N layers 14 in connection with FIG. 1A. The 0 to M layers 18 can also include no layers, in which case all of the plurality of layers of the OLED, other than the second OLED terminal 20, are developed on the first substrate 10. The second portion 4 can optionally terminate with a second part 16b of the common layer. In implementations including the first part 16a and the second part 16b, the parts 16a, 16b jointly comprise the common layer of the OLED. The common layer can be any of the plurality of layers recited in connection with the 0 to N layer 14 or the 0 to M layer 18. For example, the common layer can be the electron transfer layer. In implementations incorporating the first part 16a and the second part 16b, the two parts can each be substantially equal to half of the common layer, or can be another complementary matched set of portions of the common layer such that the two parts 16a, 16b jointly form the common layer when the two parts 16a, 16b are joined together.

Figure 2:
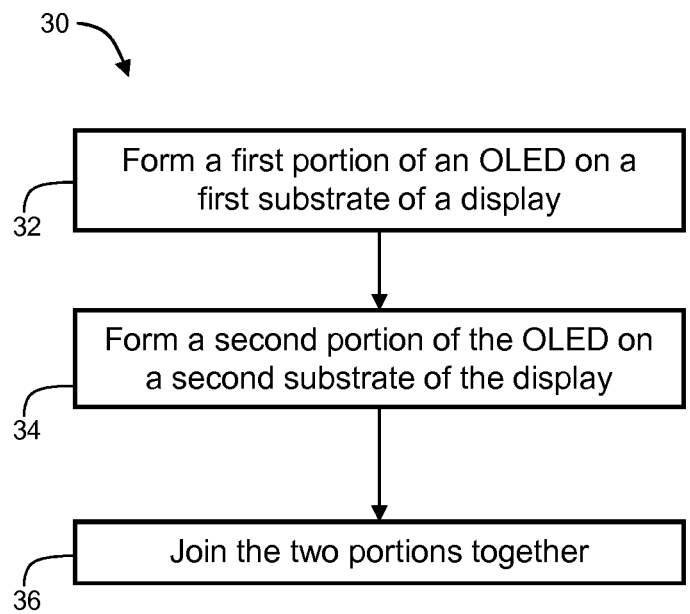
FIG. 2 is a flowchart of a process for forming an organic light emitting diode from two portions.

FIG. 2 illustrates a flowchart 30 of a process for forming an organic light emitting diode from two portions for use in a display. FIG. 2 will be described in connection with the first portion 2 and the second portion 4 illustrated in FIGS. 1A and 1B. The first portion 2 of the OLED is formed on a first substrate 10 of the display (32). The second portion 4 of the OLED is formed on a second substrate 22 of the display (34). To complete the preparation of the OLED, the first portion 2 and the second portion 4 are joined together (36).

Figures 3A, 3B:
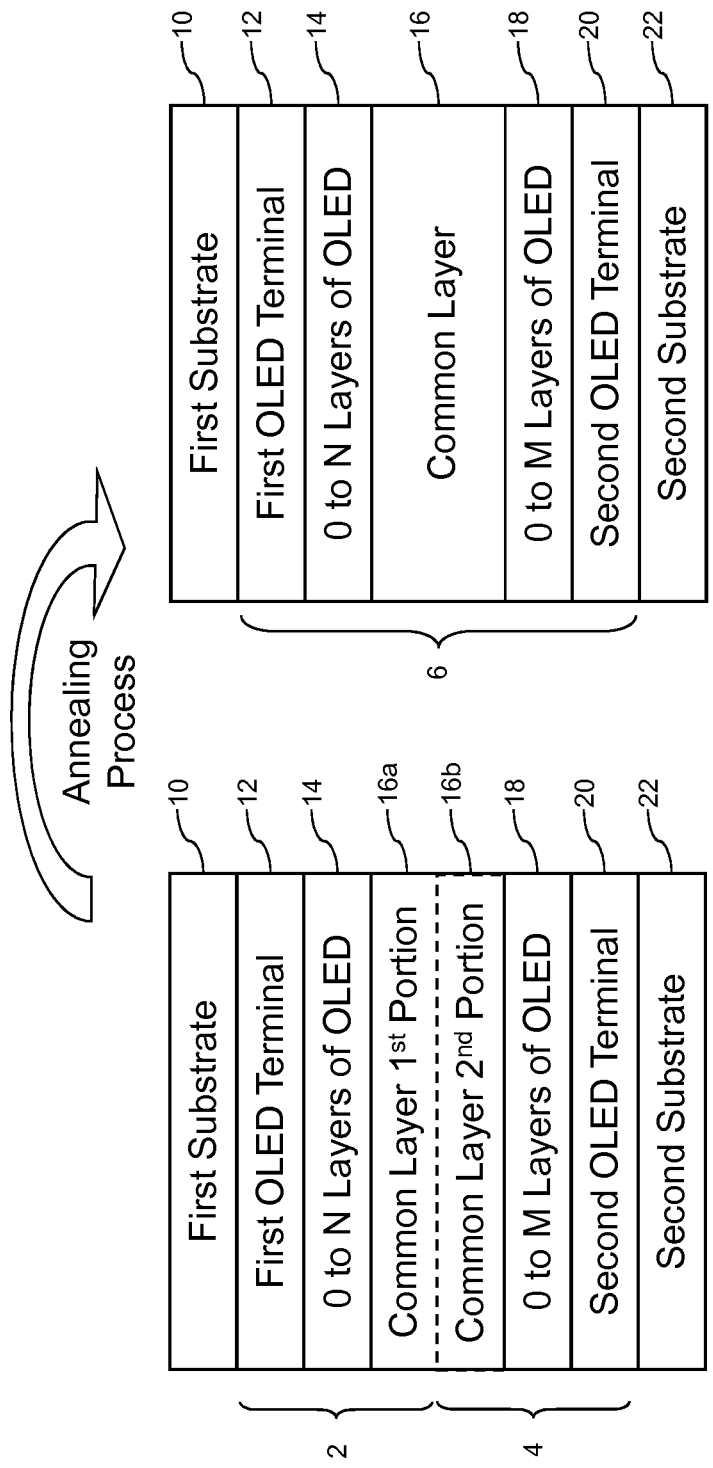
FIG. 3A illustrates a symbolic plan of a first and second portion of the organic light emitting diode while the two portions are aligned to be joined together.
FIG. 3B illustrates a symbolic plan of the organic light emitting diode shown in FIG. 3A following an annealing process to infuse the common layer together.

FIG. 3A illustrates a symbolic plan of the first portion 2 and the second portion 4 of the organic light emitting diode while the two portions are aligned to be joined together. In the implementation shown in FIGS. 3A and 3B, the first portion 2 and the second portion 4 each include a respective first part 16a and second part 16b of the common layer, which is joined together by an annealing process (FIG. 3B) to infuse ("join") the first portion 2 to the second portion 4. As shown in FIG. 3A, the first portion 2 is positioned such that the first part 16a abuts the second part 16b at an interface.

FIG. 3B illustrates a symbolic plan of the organic light emitting diode 6 shown in FIG. 3A following an annealing process to infuse the common layer 16 together. The first part 16a and the second part 16b are subjected to annealing, which can include thermal, pressure, or optical (e.g., laser) annealing. The resulting common layer 16 is a unitary layer. By terminating the first portion 2 and the second portion 4 near a mid-point of the common layer 16, such that the annealing process infuses an intralayer interface of the common layer, the annealing process avoids any interlayer interfaces. Interlayer interfaces can be more critical to the performance of the OLED than annealed intralayer interfaces, and therefore interlayer interfaces (e.g., the interfaces between the plurality of layers in the 0 to N layers 14 and/or the 0 to M layers 18) are advantageously formed by the layered deposition process rather than by an annealing process.

Figure 4A:
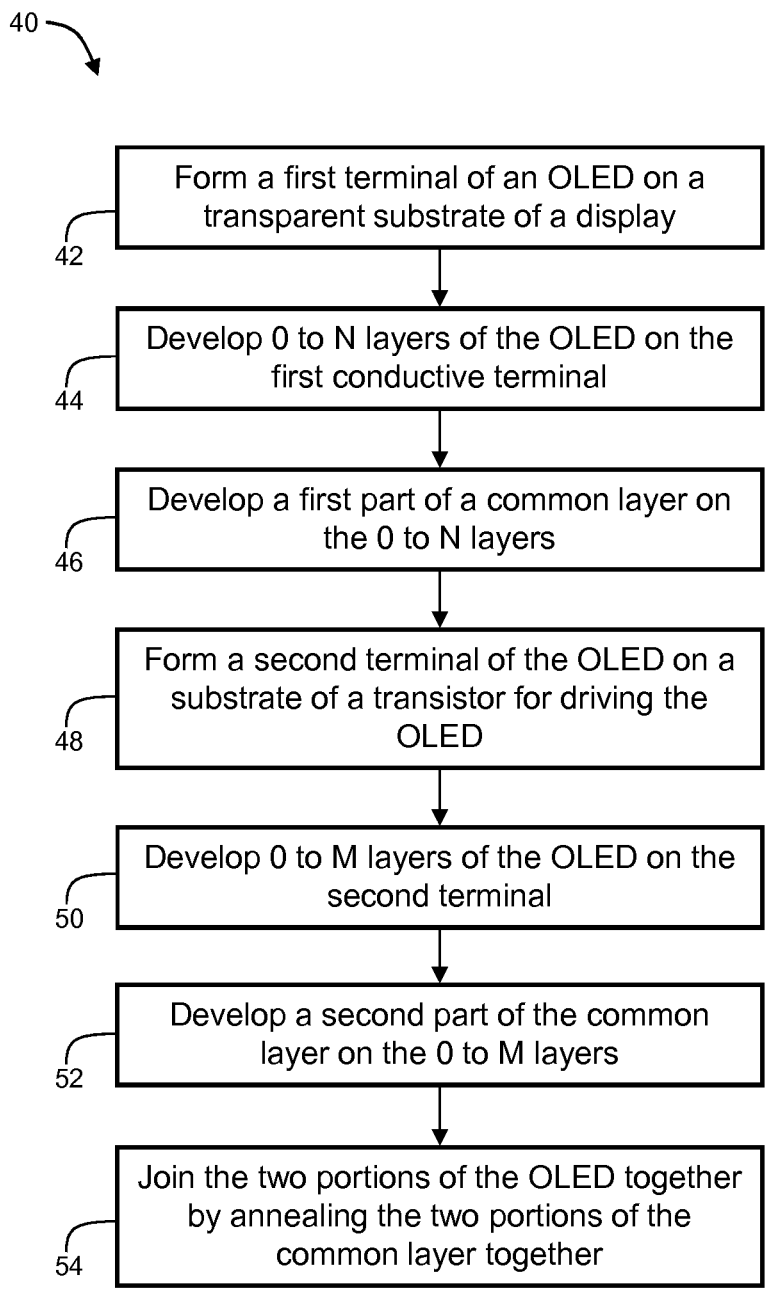
FIG. 4A is a flowchart of a process for forming an organic light emitting diode by annealing two parts of a common layer.

FIG. 4A is a flowchart 40 of a process for forming an organic light emitting diode for use in a display by annealing two parts of a common layer. A first terminal (e.g., the first terminal 12) is formed on a transparent substrate (e.g., a transparent encapsulation glass) of a display (42). 0 to N layers (e.g., the 0 to N layers 14) of the OLED are developed on the first terminal (44). The 0 to N layers are sequentially deposited on the first terminal. The 0 to N layers can include, for example, a hole injection layer, a hole transfer layer, an emission layer, an electron transfer layer, an electron injection layer, and/or a planarization layer. In addition, one or more of the layers can be omitted and/or combined with other layers. In an example, the 0 to N layers can include a hole injection and transfer layer, formed on the first terminal, and an emission layer, formed on the hole injection and transfer layer. A first part of a common layer (e.g., the electron transfer layer) is then developed on the 0 to N layers (46).

Figure 4B:
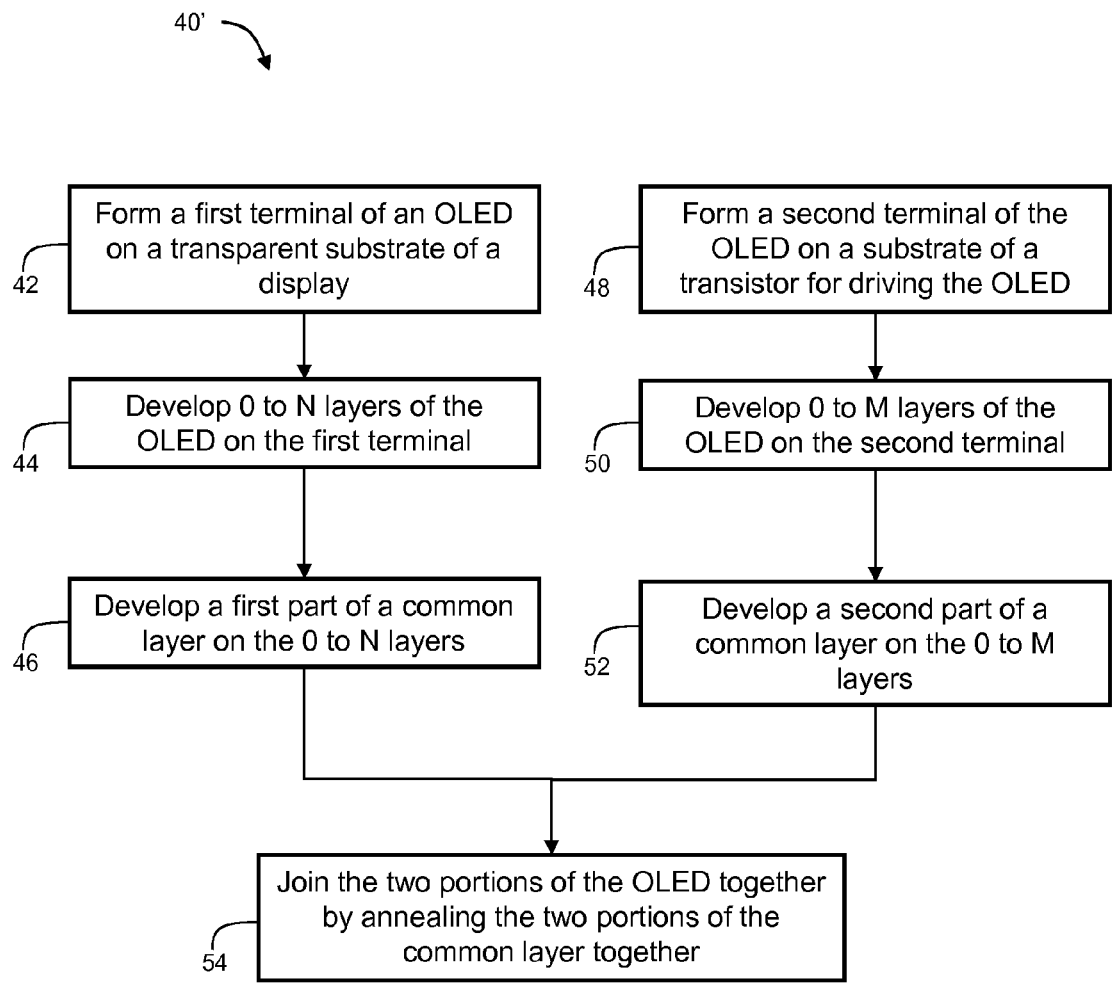
FIG. 4B illustrates a flowchart of a process similar to that shown in the flowchart in FIG. 4A, but further illustrating several aspects of the process performed in parallel.

FIG. 4B is a flowchart 40' of a process similar to that shown in the flowchart in FIG. 4A, but further illustrating several aspects of the process performed in parallel. In particular, FIG. 4B illustrates that forming the first portion (e.g., the first portion 2) of the OLED on the transparent substrate (42, 44, 46) can be carried out in parallel with forming the second portion (e.g., the second portion 4) on the substrate of a drive TFT (48, 50, 52). Parallel operations can advantageously allow for faster production times. Following the parallel operations, the two portions are joined together by annealing the two parts of the common layer together (54). While the flowcharts 40 and 40' are provided to illustrate two exemplary implementations of the present disclosure, the present disclosure is not limited to implementations where the various stages to develop the OLED are performed strictly serially or in parallel. Implementations of the present disclosure can be realized incorporating a combination of serial ordering and parallel ordering.

Next a schematic of a particular example of an OLED developed according to an example implementation of the present disclosure is described. The views shown in FIGS. 5A through 7C are generally cross sectional views of the first and second portions of the OLED, and the OLED after it has been infused ("joined"). The views schematically illustrate an example of the plurality of layers of the OLED, but the schematic views are for illustrative purposes and are not drawn to scale (e.g., the schematic illustrations are not intended to convey the relative thicknesses of the plurality of layers of the OLED).

Figure 5A:
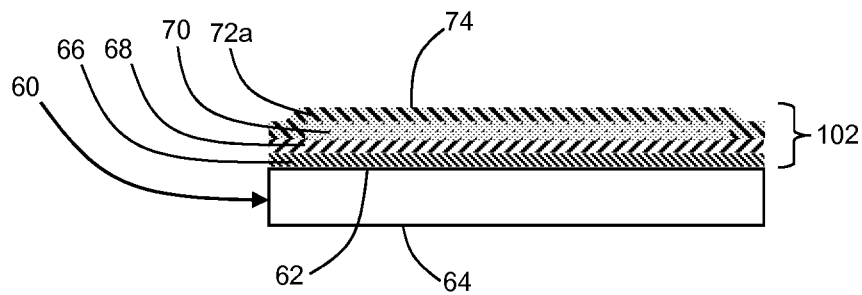
FIG. 5A is a vertical section of an assembled first portion of an organic light emitting diode formed on an encapsulation substrate.

FIG. 5A is a vertical section of a first portion 102 of an organic light emitting diode formed on an encapsulation substrate 60. The encapsulation substrate 60 has an enclosed side 62 and an exposed side 64. An anode terminal 66 is formed on the enclosed side 62 of the encapsulation substrate 60. The encapsulation substrate 60 and the anode terminal are each desirably substantially visually transparent to allow light from the OLED to be emitted through the exposed side 64. The anode terminal 66 can be formed from indium tin oxide ("ITO") or a comparable conductive visually transparent material. The anode terminal 66 can be formed on the encapsulation substrate 60 by a deposition process to develop a layer of ITO (or comparable material) on the encapsulation substrate 60. A hole transfer and injection layer 68 is then developed (e.g., "deposited") on the anode terminal 66. The hole transfer and injection layer 68 can be developed on the anode terminal 66 by a deposition process or a similar technique. An emission layer 70 is then developed on the hole transfer and injection layer 68. A first part 72a of an electron transfer layer is developed on the emission layer 70. The first part 72a of the electron transfer layer has an exposed first surface 74. The first part 72a of the electron transfer layer is approximately half of the thickness of the full electron transfer layer (72 in FIG. 5C). The development of the first portion 102 is halted with the exposed first surface 74.

Figure 5B:
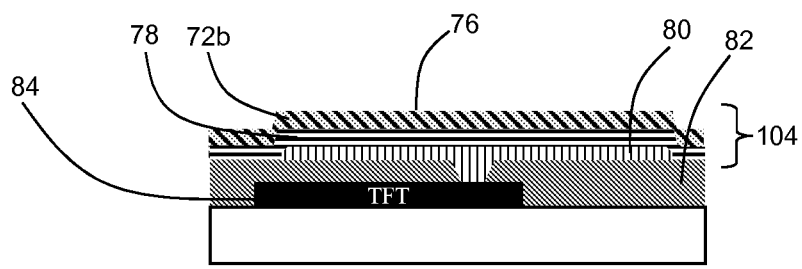
FIG. 5B is a vertical section of an assembled second portion of an organic light emitting diode formed on a TFT substrate and configured to join the first portion illustrated in FIG. 5A.

FIG. 5B is a vertical section of a second portion 104 of the organic light emitting diode formed on a TFT substrate and configured to join the first portion 102 illustrated in FIG. 5A. A planarization substrate 82 is developed on a drain terminal 84 of the TFT. The planarization substrate 82 is formed with an aperture 85 such that at least a portion of the drain terminal 84 remains exposed through the planarization substrate 82. A cathode terminal 80 is then developed (e.g., "deposited") on the aperture 85 such that the cathode terminal 80 is securely electrically coupled to the drain terminal 84 of the TFT. An electron injection layer 78 is then developed on the cathode terminal 80. The second part 72b of the electron transfer layer is then developed on the electron injection layer 78. The second part 72b of the electron transfer layer can be approximately half of the electron transfer layer such that the first part 72a and the second part 72b together form the full electron transfer layer. The second part 72b includes an exposed second surface 76. The development of the second portion 104 is halted with the exposed second surface 76 of the second part 72b.

The development of the plurality of layers 66, 68, 70, 72a, 72b, 78, 80, 82 of the first portion 102 and the second portion 104 can each be formed by a deposition process or similar technique for forming thin films of material.

Figure 5C:
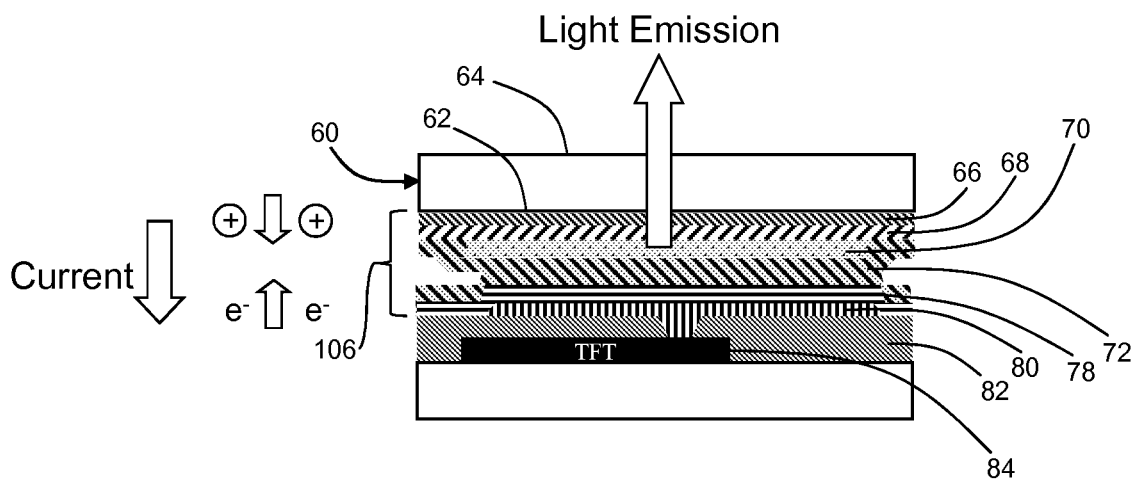
FIG. 5C is a vertical section of an organic light emitting diode formed by annealing a first part and a second part of a common layer of the first and second portions shown in FIGS. 5A and 5B.

FIG. 5C is a vertical section of an organic light emitting diode 106 formed by annealing the first part 72a and the second part 72b of the electron transfer layer shown in FIGS. 5A and 5B. The first portion 102 is positioned such that the exposed first surface 74 of the first part 72a of the electron transfer layer abuts the exposed second surface 76 of the second part 72b of the electron transfer layer. The interface between the exposed surfaces 74, 76 is thus an intralayer interface, and the two parts 72a, 72b can be infused ("joined") by annealing the two parts 72a, 72b together to form the unitary electron transfer layer 72. The annealing can be accomplished by a thermal annealing process at, for example, 200 to 300 degrees Celsius.

An exemplary operation of the OLED 106 illustrated schematically in FIG. 5C is described next. In operation, the TFT begins to drive a current to flow generally toward the drain terminal 84, such that the cathode terminal 80 acquires a negative voltage with respect to the anode terminal 66. Once the voltage difference between the cathode terminal 80 and the anode terminal 66 is sufficient to exceed an operating voltage (i.e., "on voltage") of the OLED, electrons injected in the electron injection layer 78 from the cathode terminal 80. The injected electrons are urged generally away from the cathode terminal 80 toward the emission layer 70, which can be considered a recombination layer. At the same time, positively charged holes are injected from the anode terminal 66 and transferred through the hole injection and transfer layer 68. The holes are urged generally away from the anode terminal 66 toward the emission layer 70.

In the emission layer, the electrons generally occupy the lowest unoccupied molecular orbital level (LUMO) in the emission layer 70 until recombining with a hole. The recombined electrons radiatively decay to the highest occupied molecular orbital level (HOMO) in the emission layer 70, and light is emitted according to the accompanying change in energy. The light emitted from the emission layer 70 passes through the encapsulation substrate 60 to emerge from the exposed side 64 of the encapsulation surface. Light that is initially directed away from the encapsulation surface 60

(e.g., toward the cathode terminal 80) is desirably reflected by the cathode terminal 80 to be emitted through the encapsulation surface 60. The cathode terminal 60 is advantageously formed from a reflective substance, such as a metallic material. The cathode terminal 80 is also advantageously selected to have a work function suitable to injection electrons having an energy sufficient to occupy the LUMO in the emission layer 70. Thus, the material characteristics of the emission layer 70 (e.g., HOMO and LUMO) can influence the selection of the cathode terminal 80, and also the anode terminal 66.

Figure 6A:
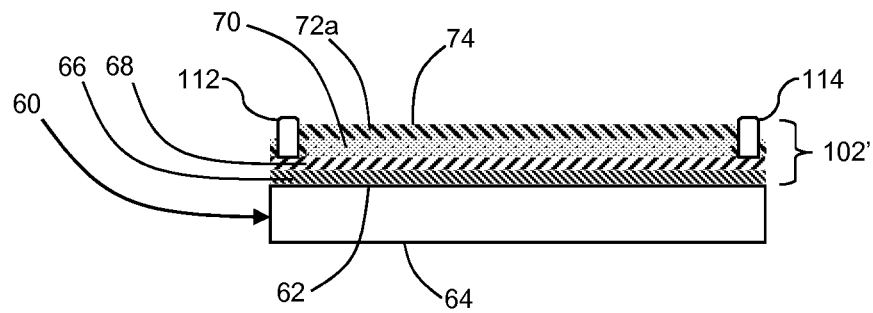
FIG. 6A is a vertical section of a first portion of an organic light emitting diode similar to that shown in FIG. 5A and incorporating spacers.

FIG. 6A illustrates a first portion 102' of an organic light emitting diode similar to that shown in FIG. 5A, but incorporating spacers 112, 114. In the cross-sectional view of FIG. 6A, the spacers 112, 114 are placed on the opposing sides of the first portion 102'. The spacers 112, 114 are placed on the anode terminal 66 to avoid interrupting signals carried on the anode terminal 66, however, the spacers 112, 114 can be placed on other layers such as, for example, the hole injection and transfer layer 68. The spacers 112, 114 can completely surround the pixel area of the OLED and can include a plurality of columns and/or cylinders arranged horizontally and/or vertically with respect to the plane of the display. The spacers 112, 114 can be composed of materials including, for example, a nitrides and/or oxides. The spacers 112, 114 can advantageously provide a physical separation between layers of adjacent OLEDs developed on the encapsulation substrate 60. As described in connection with FIG. 6C, the spacers 112, 114 can also regulate the pressure applied to the OLED 106' to prevent the OLED 106' from being compacted ("crushed") when the first portion 102' and the second portion 104' are joined together.

During manufacturing, the spacers 112, 114 can also assist in the alignment of a shadow mask which covers pixels not receiving deposited semiconductor layers. For example, when a patterned red, green, and blue configuration of pixels is being developed on the encapsulation substrate, the shadow mask can be placed over the display panel to provide small holes through which layers for particular colors can be deposited on the corresponding the pixel areas. By providing the spacers 112, 114, the shadow mask can rest on the spacers and avoid warping or stretching of the shadow mask when positioning it over the display panel.

Figure 6B:
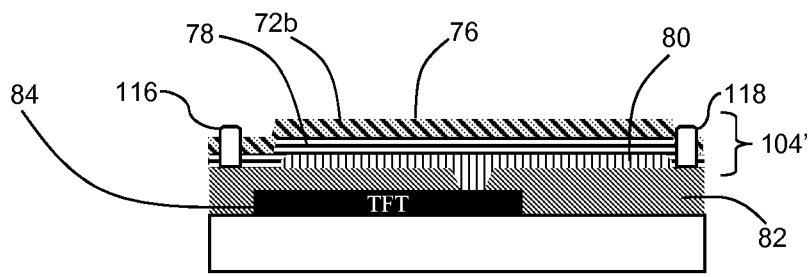
FIG. 6B is a vertical section of a second portion of an organic light emitting diode similar to that shown in FIG. 5B and incorporating spacers.

FIG. 6B illustrates a second portion 104' of an organic light emitting diode similar to that shown in FIG. 5B, but incorporating spacers 114, 116. Similar to the description of the spacers 112, 114 provided in connection with FIG. 6A, the spacers 114, 116 are placed ("positioned") on the planarization substrate 82. The spacers 114, 116 are advantageously positioned to be aligned with the spacers 112, 114 of the first portion 102' such that the spacers 114, 116 abut corresponding ones of the spacers 112, 114 when the first portion 102' is joined to the second portion 104'.

Figure 6C:
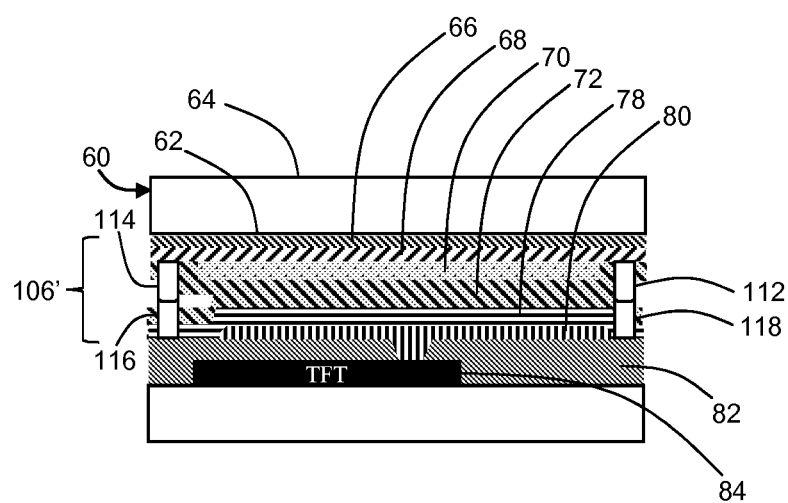
FIG. 6C is a vertical section of an organic light emitting diode formed by annealing a first part and a second part of a common layer of the first and second portions shown in FIGS. 6A and 6B.

FIG. 6C illustrates an organic light emitting diode formed by annealing a first part and a second part of a common layer of the first and second portions shown in FIGS. 6A and 6B. The OLED 106' is similar to the OLED 106 shown in FIG. 5C, except that the OLED 106' includes the spacers. As shown in FIG. 6C the respective spacers of the first portion 102' and the second portion 104' abut one another in the assembled OLED 106' to protect the deposited layers of the OLED 106' (e.g., the layers 70, 72, 78, 80) from being damaged due to compression during the joining of the two portions. Properly aligned at assembly, the spacer 114 of the first portion 102' abuts the spacer 116 of the second portion 104' and the spacer 112 of the first portion 102' abuts the spacer 118 of the second portion 104'.

Figure 7A:
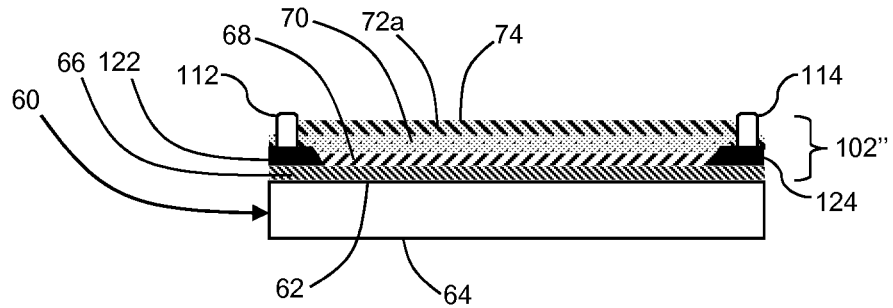
FIG. 7A is a vertical section of a first portion of an organic light emitting diode similar to that shown in FIG. 6A and incorporating banks.

FIG. 7A illustrates a first portion 102" of an organic light emitting diode similar to that shown in FIG. 6A and incorporating banks 122, 124. The banks 122, 124 are placed ("positioned") on the anode terminal 66 to surround the hole injection and transfer layer 68. As shown in FIG. 7A, the bank structure provided by the banks 122, 124 prevent the first part 72a of the electron transfer layer from abutting the hole injection and transfer layer 68. The bank structure thus contributes to the performance of the OLED 106" by ensuring that the recombination events occur substantially within the emission layer 70 rather than in the regions where the electron transfer layer 72 directly abuts the hole injection and transfer layer 68. For example, FIGS. 5A and 6A provide examples where a sub-region of the electron transfer layer 72 directly abuts a sub-region of the hole injection and transfer layer 68, thus providing a path for electrons to recombine with holes outside of the emission layer 70.

Figure 7B:
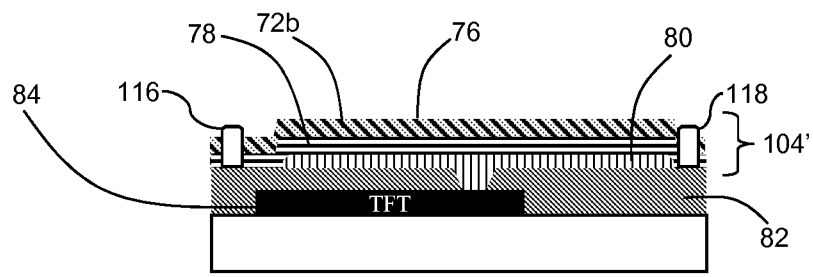
FIG. 7B is a vertical section of a second portion of an organic light emitting diode similar to that shown in FIG. 6B and configured to be joined to the first portion illustrated in FIG. 7A.
Figure 7C:
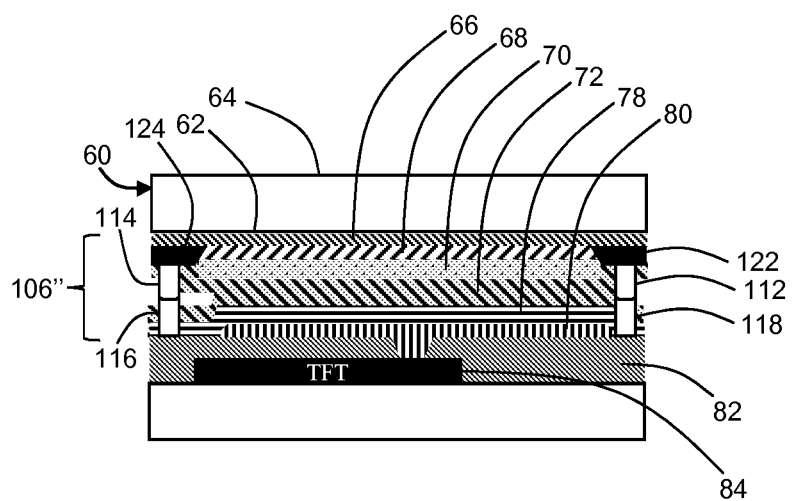
FIG. 7C is a vertical section of an organic light emitting diode formed by annealing a first part and a second part of a common layer of the first and second portions shown in FIGS. 7A and 7B.

FIG. 7B illustrates a second portion 104' of an organic light emitting diode similar to that shown in FIG. 6B and configured to be joined to the first portion illustrated in FIG. 7A. FIG. 7C illustrates an organic light emitting diode 106" formed by annealing a first part and a second part of a common layer of the first and second portions shown in FIGS. 7A and 7B. As shown in FIG. 7C, the assembled OLED 106" includes both the spacers structure described in connection with FIGS. 6A through 6C, and the bank structure described in connection with FIG. 7A.

Aspects of the present disclosure provide for annealing two parts of a common layer that meet at an intralayer interface to join together first and second portions of an OLED. For example, the common layer can be an electron transfer layer. In implementations where the design parameters of the OLED provide that the electron transfer layer is the thickest layer of the OLED, utilizing the electron transfer layer as the common layer can be advantageous because the two parts of the common layer separately deposited on the first portion and the second portion are thicker than if another layer is utilized as the common layer.

Aspects of the present disclosure can also be applied to OLEDs in a multi-stacked structure. In a multi-stack OLED, a first portion of the multi-stack OLED is developed on a first substrate, and a second portion of the multi-stack OLED is developed on a second substrate. The two portions are then joined together to form the multi-stack OLED.

Aspects of the present disclosure also apply to color displays. Individual OLEDs can be formed ("manufactured") according to the present disclosure with a color filter introduced between the emission layer 70 and the exposed side 64 of the encapsulation substrate 60. In implementations where the OLED is configured to emit, for example, white light, color filters can be inserted to provide for emission of base colors of a color display such as, for example, red, green, and blue filters. Additionally or alternatively, the OLED can be configured (such as by choice of the compositions and/or thicknesses of the plurality of layers in the OLED) to emit particular colors of light, and a pattern of different colors can be repeated across a display to form a color display having, for example, red, green, and blue color components.

Aspects of the present disclosure provide a method of manufacturing an OLED by separately forming opposing terminals of the OLED on two separate substrates, developing a plurality of layers of the OLED on one or both of the two terminals, and joining together the two portions. OLEDs manufactured by this process offer advantages over existing OLEDs, because both terminals are deposited on the respective substrates. Electrical connections to each terminal of the OLED, such as an electrical connection to a terminal of a driving transistor, do not rely on separate contacts that must be carefully aligned and which can require pressure to maintain efficient charge transfer. In particular, the cathode terminal can be directly deposited on the drain terminal of an n-type thin film transistor acting as a drive transistor. Such a configuration allows the drive transistor to drive current through the formed OLED while the gate-source voltage of the drive transistor ("Vgs") is unaffected by the operating voltage of the OLED. In particular, a shift in the operation voltage of the OLED ("$V_{OLED}$") over the lifetime of the OLED does not impact the voltage Vgs applied across the drive transistor. OLEDs formed according to aspects of the present disclosure provide a reverse OLED configuration such that the cathode of the OLED can be securely coupled (e.g., by a deposition, evaporation, or similar process) to a drain terminal of an n-type drive transistor. Aspects of the present disclosure can also be applied to forming an OLED with an anode terminal deposited on a source terminal of a p-type drive transistor.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of manufacturing an organic light emitting diode having a first terminal, a second terminal, and a plurality of layers between the first terminal and the second terminal, the method comprising:

forming, on a first substrate, the first terminal of the organic light emitting diode;

forming, on a second substrate, the second terminal of the organic light emitting diode;

developing a first portion of the plurality of layers on the first terminal;

developing a second portion of the plurality of layers on the second terminal;

joining the first portion of the plurality of layers to the second portion of the plurality of layers such that the plurality of layers is situated in between the first terminal and the second terminal, wherein the plurality of layers includes a common layer having a first part included in the first portion of the plurality of layers, the common layer having a second part included in the second portion of the plurality of layers, and wherein:

the developing the first portion of the plurality of layers includes depositing the first part of the common layer, the developing the second portion of the plurality of layers includes depositing the second part of the common layer, the joining is carried out by annealing the first part and the second part of the common layer, the common layer is an electron transfer layer.

2. A method of manufacturing an organic light emitting diode having a first terminal, a second terminal, and a plurality of layers between the first terminal and the second terminal, the method comprising:

forming, on a first substrate, the first terminal of the organic light emitting diode;

forming, on a second substrate, the second terminal of the organic light emitting diode;

developing a first portion of the plurality of layers on the first terminal;

developing a second portion of the plurality of layers on the second terminal;

joining the first portion of the plurality of layers to the second portion of the plurality of layers such that the plurality of layers is situated in between the first terminal and the second terminal, prior to the joining, placing a first spacer on the first portion of the plurality of layers and a second spacer on the second portion of the plurality of layers, and wherein during the joining, the first spacer abuts the second spacer so as to prevent the plurality of layers from being compressed.

3. A method of manufacturing an organic light emitting diode having a first terminal, a second terminal, and a plurality of layers between the first terminal and the second terminal, the method comprising:

forming, on a first substrate, the first terminal of the organic light emitting diode;

forming, on a second substrate, the second terminal of the organic light emitting diode;

developing a first portion of the plurality of layers on the first terminal; and developing a second portion of the plurality of layers on the second terminal;

joining the first portion of the plurality of layers to the second portion of the plurality of layers such that the plurality of layers is situated in between the first terminal and the second terminal, wherein the developing the first portion of the plurality of layers or the developing the second portion of the plurality of layers includes placing a bank at a periphery of a hole transfer layer so as to prevent the hole transfer layer from abutting an electron transfer layer.

* * * * *